United States Patent
Ko et al.

(10) Patent No.: US 8,513,652 B2
(45) Date of Patent: Aug. 20, 2013

(54) ORGANIC LIGHT EMITTING DISPLAY APPARATUS AND METHOD OF MANUFACTURING THE SAME

(75) Inventors: Moo-Soon Ko, Yongin (KR); Jae-ho Yoo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 304 days.

(21) Appl. No.: 12/902,509

(22) Filed: Oct. 12, 2010

(65) Prior Publication Data

US 2011/0140114 A1 Jun. 16, 2011

(30) Foreign Application Priority Data

Dec. 10, 2009 (KR) .................. 10-2009-0122530

(51) Int. Cl.
*H01L 29/08* (2006.01)
*H01L 51/00* (2006.01)
*H01L 21/00* (2006.01)

(52) U.S. Cl.
USPC ............... 257/40; 257/59; 257/79; 257/86; 438/82; 438/99

(58) Field of Classification Search
USPC .............. 257/40, 59, 79, 86; 438/82, 99
See application file for complete search history.

(56) References Cited

U.S. PATENT DOCUMENTS

| 7,510,455 | B2 | 3/2009 | Suzuki |
| 2005/0140288 | A1 | 6/2005 | Suzuki |
| 2006/0017377 | A1* | 1/2006 | Ryu ............................ 313/504 |
| 2007/0035239 | A1* | 2/2007 | Kang et al. .................. 313/504 |
| 2007/0124121 | A1* | 5/2007 | Freier ............................ 703/2 |
| 2007/0200123 | A1 | 8/2007 | Yamamichi et al. |

FOREIGN PATENT DOCUMENTS

| JP | 2005-197009 | 7/2005 |
| JP | 2007-123067 | 5/2007 |
| KR | 10-2005-0067055 | 6/2005 |
| KR | 1020060037728 A | 5/2006 |
| KR | 1020060135795 A | 12/2006 |
| KR | 10-2008-0061675 | 7/2008 |

OTHER PUBLICATIONS

Korean Office action issued by Korean Patent Office on Apr. 25, 2011, corresponding to Korean Patent application No. 10-2009-0122530 and Request for Entry of the Accompanying Office Action attached herewith.

* cited by examiner

*Primary Examiner* — Long Tran
(74) *Attorney, Agent, or Firm* — Robert E. Bushnell, Esq.

(57) ABSTRACT

An organic light emitting display apparatus and a method of manufacturing the same wherein in the organic light emitting device, each of the first to third sub pixels includes: a thin film transistor; a pixel electrode electrically connected to the thin film transistor; and an organic light emitting layer electrically connected to the pixel electrode; and an opposite electrode formed on each of the organic light emitting layers. A pad part is disposed on the non-display region, the pad part including at least one side exposed. The first sub pixel includes a first transmissive conductive layer and a second transmissive conductive layer sequentially stacked between the pixel electrode of the first sub pixel and the organic light emitting layer. The second sub pixel includes the first transmissive conductive layer between the pixel electrode of the first sub pixel and the organic light emitting layer.

28 Claims, 15 Drawing Sheets

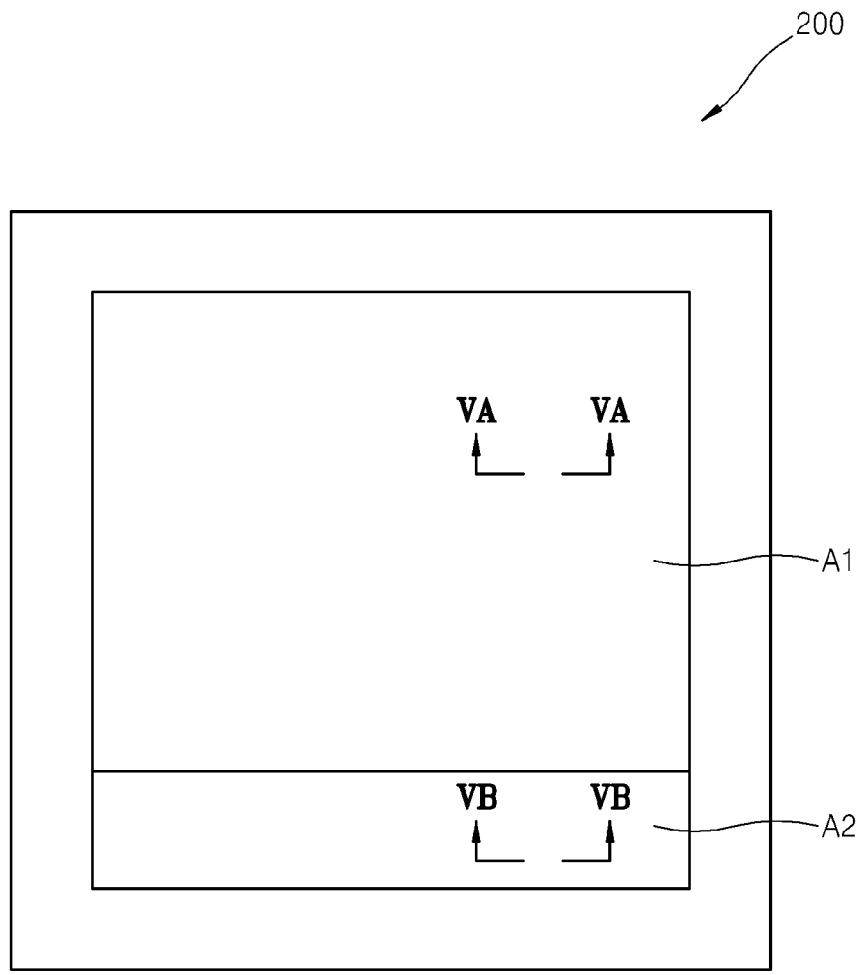

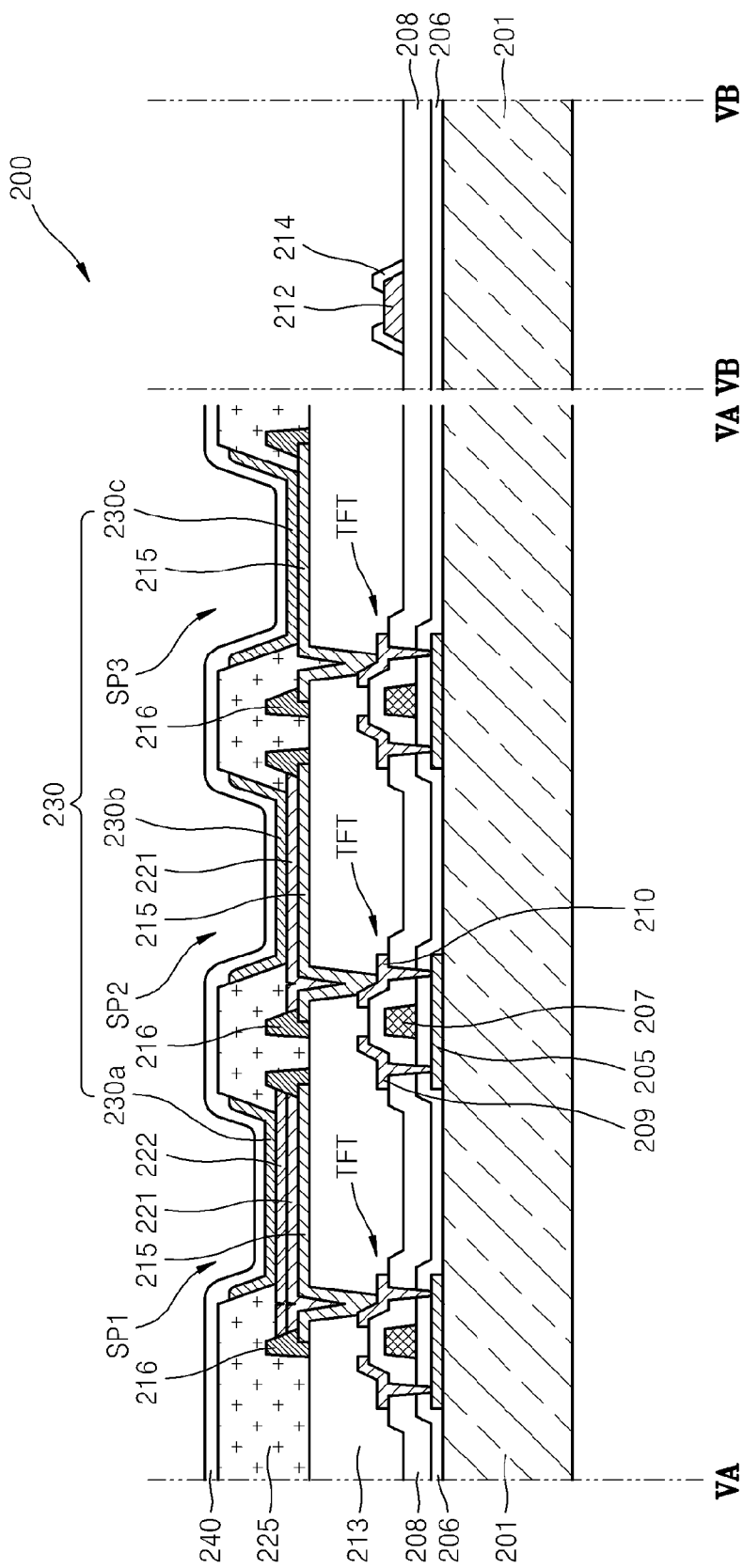

ORGANIC LIGHT EMITTING DISPLAY APPARATUS AND METHOD OF MANUFACTURING THE SAME

CROSS-REFERENCE TO RELATED APPLICATION

This application claims the benefit of Korean Patent Application No. 10-2009-0122530, filed on Dec. 10, 2009, in the Korean Intellectual Property Office, the disclosure of which is incorporated herein by reference.

BACKGROUND

1. Field

An aspect of the present invention relates to an organic light emitting display apparatus and a method of manufacturing the same, and more particularly to an organic light emitting display apparatus having improved image quality and a method of manufacturing the same.

2. Description of the Related Art

Recently, there has been a trend of replacing conventional display devices with portable thin flat display devices. Among flat display devices, organic and inorganic light emitting display apparatuses are self light emitting display devices and have a wide viewing angle, an excellent contrast, and also a fast response speed. Therefore, organic and inorganic light emitting display apparatuses draw great attention as next generation display devices. Additionally, organic light emitting display apparatuses, which include a light emitting layer formed of an organic matter, have excellent characteristics with respect to brightness, a driving voltage, and a response speed and can generate various kinds of colors, compared to inorganic light emitting display apparatuses.

In an organic light emitting display apparatus, an organic light emitting layer is disposed between a cathode electrode and an anode electrode and visible rays are generated in the organic light emitting layer connected to both electrodes when a voltage is applied to both of the electrodes.

An organic light emitting layer includes a layer for emitting visible rays of different colors such as red, green, and blue. Optical characteristics such as brightness and color coordinate of visible rays emitted by an organic light emitting layer may vary compared to those of visible rays emitted by another organic light emitting layer. Therefore, there are limitations in improving image quality of a manufactured organic light emitting display apparatus.

SUMMARY

An aspect of the present invention provides an organic light emitting display apparatus having improved image quality and a method of manufacturing the same.

According to an aspect of the present invention, there is provided an organic light emitting display apparatus in which a display region and a non-display region are defined on a substrate, the display region including a first sub pixel, a second sub pixel, and a third sub pixel, wherein each of the first to third sub pixels includes a thin film transistor; a pixel electrode electrically connected to the thin film transistor; and an organic light emitting layer electrically connected to the pixel electrode; and an opposite electrode formed on each of the organic light emitting layers, and wherein a pad part is disposed on the non-display region, the pad part including at least one side exposed; the first sub pixel includes a first transmissive conductive layer and a second transmissive conductive layer sequentially stacked between the pixel electrode of the first sub pixel and the organic light emitting layer; and the second sub pixel includes the first transmissive conductive layer between the pixel electrode of the second sub pixel and the organic light emitting layer.

The pixel electrodes may include indium tin oxide (ITO).

The pixel electrodes may be formed as a stacked layer structures of ITO/Ag/ITO.

The organic light emitting layer may include an organic light emitting layer to emit red visible rays corresponding to the first sub pixel; an organic light emitting layer to emit green visible rays corresponding to the second sub pixel; and an organic light emitting layer to emit blue visible rays corresponding to the third sub pixel.

The pad part may be formed of a same material as a material used to from source and drain electrodes of each of the thin film transistors.

According to another aspect of the present invention, the pad part may include Ti.

The pad part may be formed as a stacked layer structure of Ti/Al/Ti.

The first transmissive conductive layer and the second transmissive conductive layer may include ITO.

The organic light emitting display apparatus may further include an insulating member disposed to cover an outer edge of each of the pixel electrode.

The insulating member may be disposed to cover a top edge and side of each of the pixel electrode.

The insulating member may include acryl.

The first transmissive conductive layer and the second transmissive conductive layer may be disposed to contact a side of the insulating member.

According to another aspect of the present invention, there is provided a method of manufacturing an organic light emitting display apparatus where a display region and a non-display region are defined on a substrate, the display region including a first sub pixel, a second sub pixel, and a third sub pixel, wherein forming of each of the first to third sub pixels includes forming a thin film transistor on the substrate; forming a pixel electrode that is electrically connected to the thin film transistor; forming an organic light emitting layer that is electrically connected to the pixel electrode; and forming an opposite electrode on the organic light emitting layer, and wherein a pad part is disposed on the non-display region, the pad part including at least one side exposed; the first sub pixel includes a first transmissive conductive layer and a second transmissive conductive layer sequentially stacked between the pixel electrode of the first sub pixel and the organic light emitting layer; and the second sub pixel includes the first transmissive conductive layer between the pixel electrode of the second sub pixel and the organic light emitting layer.

The pixel electrodes may include ITO.

The pixel electrodes may be formed as a stacked layer structure of ITO/Ag/ITO.

The organic light emitting layer may include an organic light emitting layer to emit red visible rays corresponding to the first sub pixel; an organic light emitting layer to emit green visible rays corresponding to the second sub pixel; and an organic light emitting layer to emit blue visible rays corresponding to the third sub pixel.

The pad part may be formed of the same material as a material used to from source and drain electrodes of each of the thin film transistors.

The pad part may include Ti.

The pad part may be formed as a stacked layer structure of Ti/Al/Ti.

The first transmissive conductive layer and the second transmissive conductive layer may include ITO.

The first transmissive conductive layer and the second transmissive conductive layer may be patterned using a wet etching method.

While the first transmissive conductive layer and the second transmissive conductive layer are patterned using the wet etching method, the exposed side of the pad part may contact a wet etching solution.

The method may further include forming an insulating member disposed to cover an outer edge of the pixel electrode.

The insulating member may be formed to cover a top edge and side of the pixel electrode.

The insulating member may include acryl.

The forming of the first transmissive conductive layer and the second transmissive conductive layer may be performed after the forming of the insulating member.

The first transmissive conductive layer and the second transmissive conductive layer may be formed to contact a side of the insulating member.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 4 is a plan view illustrating an organic light emitting display apparatus according to another embodiment of the present invention;

FIGS. 6A through 6F are sequential sectional views illustrating a method of manufacturing an organic light emitting display apparatus according to another embodiment of the present invention.

DETAILED DESCRIPTION

Figure 1:
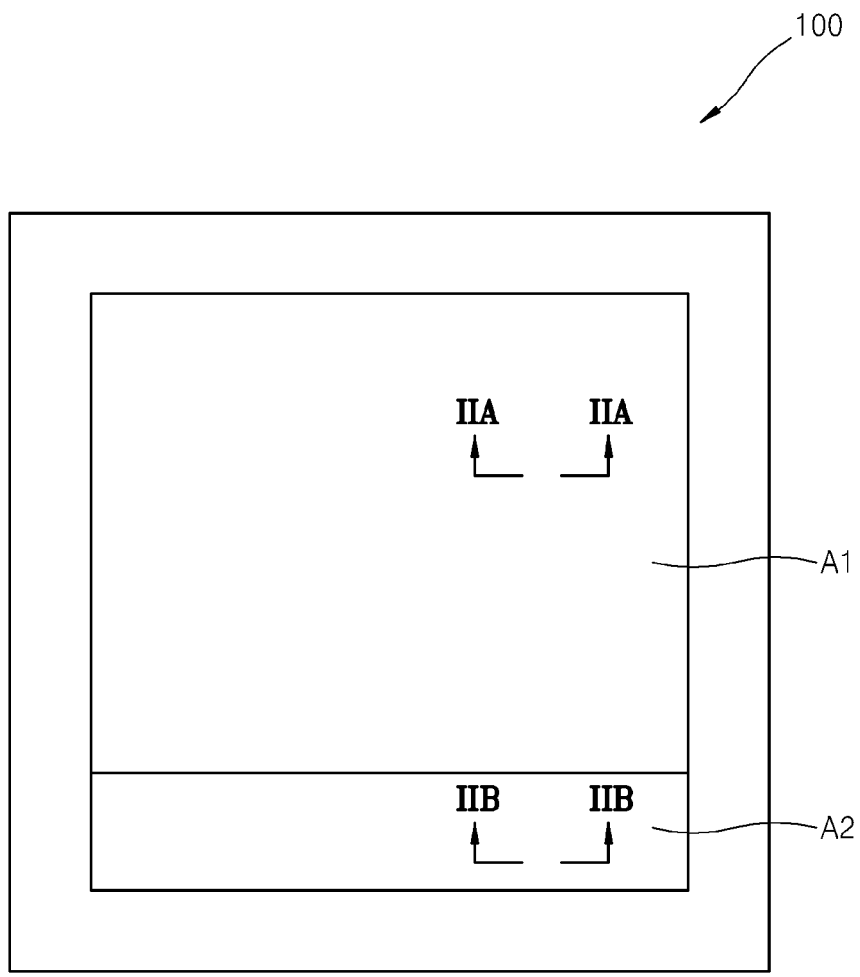
FIG. 1 is a plan view illustrating an organic light emitting display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process. Further, some of the elements that are not essential to the complete understanding of the invention are omitted for clarity. Also, like reference numerals refer to like elements throughout. Hereinafter, exemplary embodiments of the present invention will be described with reference to the accompanying drawings.

Figure 2:
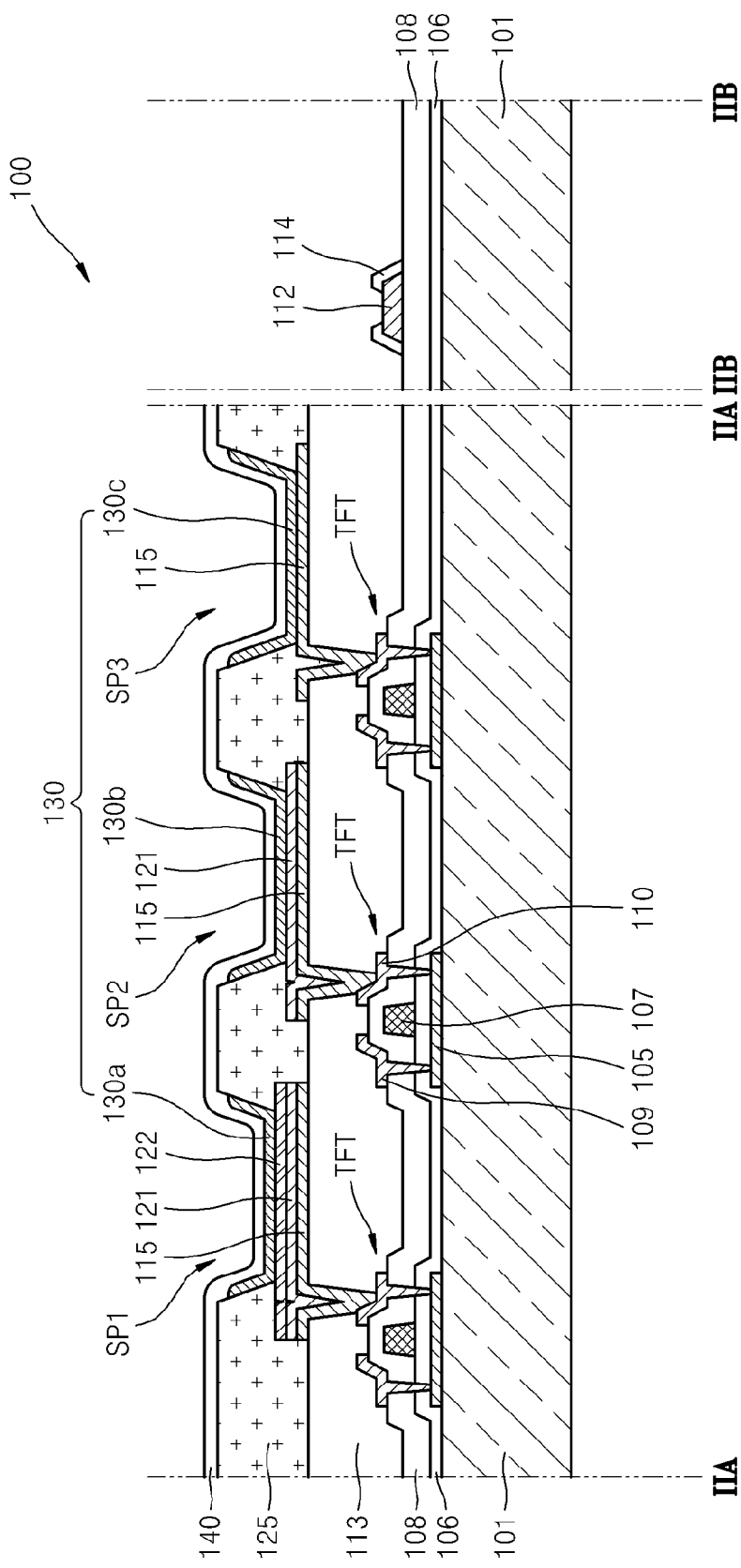
FIG. 2 is an enlarged sectional view taken at lines IIA-IIA and IIB-IIB of FIG. 1.

FIG. 1 is a plan view illustrating an organic light emitting display apparatus according to an embodiment of the present invention. FIG. 2 is an enlarged sectional view taken at lines IIA-IIA and IIB-IIB of FIG. 1.

An organic light emitting display apparatus 100 according to an aspect of the present invention includes a display region A1 and a non-display region A2 defined on a substrate 101. A first sub pixel SP1, a second sub pixel SP2, and a third sub pixel SP3 are disposed on the display region A1 in order to generate visible rays (of different colors). The sub pixels SP1, SP2, and SP3 may be sub pixels of different colors. According to an aspect of the present invention, the first sub pixel SP1, the second sub pixel SP2, and the third sub pixel SP3 are defined as a red sub pixel, a green sub pixel, and a blue sub pixel, respectively. Although only one first sub pixel SP1, one second sub pixel SP2, and one third sub pixel SP3 are shown in FIGS. 1 and 2, this is just for convenience of description. Thus, the organic light emitting display apparatus 100 may include a plurality of the first sub pixels SP1, a plurality of the second sub pixels SP2, and a plurality of the third sub pixels SP3.

Each of the first sub pixel SP1, the second sub pixel SP2, and the third sub pixel SP3 includes a thin film transistor (TFT), a pixel electrode 115, and an organic light emitting layer 130, and an opposite electrode 140 is commonly formed on the sub pixels.

The non-display region A2 may be formed smaller than the display region A1 and may be disposed adjacent to the display region A1. A pad part 112 for applying an electrical signal or power to the display region A1 is disposed on the non-display region A2. The pad part 112 may be electrically connected to external circuits (not shown) during a following process.

Each of the TFTs included in the first sub pixel SP1, the second sub pixel SP2, and the third sub pixel SP3 includes an active layer 105, a gate electrode 107, a source electrode 109, and a drain electrode 110.

In more detail, a configuration of each element will be described with reference to one TFT of FIG. 2.

First, the substrate 101 may be formed of a transparent glass material using $SiO_2$ as a principal component. The substrate 101 is not necessarily limited to this and thus may be formed of a transparent plastic material. The plastic material may be an organic material selected from the group consisting of an insulating organic material including polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, PC, TAC, and cellulose acetate propionate (CAP).

Additionally, the substrate 101 may be formed of a metal. When the substrate 101 is formed of a metal, it may include at least one selected from the group consisting of carbon, iron, chrome, manganese, nickel, titanium, molybdenum, stainless steel (SUS), Invar alloy, Inconel alloy, and Kavar alloy. But, the present invention is not limited thereto. The substrate 101 may be formed of a metal foil.

A buffer layer (not shown) may be formed on a surface of the substrate 101 to form a flat surface on the substrate 101 and to prevent an impurity element from penetrating into the substrate 101. The buffer layer (not shown) may be formed of $SiO_2$ and/or $SiN_x$.

The active layer 105 has a predetermined pattern and is formed on the buffer layer (not shown). The active layer 105 may be formed of an inorganic semiconductor, such as amorphous silicon or poly silicon, or an organic semiconductor, and includes a source region, a drain region, and a channel region.

The source and drain regions may be formed by doping the active layer 105, which may be formed of amorphous silicon or poly silicon, with an impurity. If a group III element, e.g., boron (B), is used as a dopant, a p-type semiconductor is formed. If a group V element, e.g., nitrogen (N), is used as a dopant, an n-type semiconductor is formed.

A gate insulation layer 106 is formed on the active layer 105 and the gate electrode 107 is formed at a predetermined region on the gate insulation layer 106. The gate insulation layer 106 for insulating the active layer 105 from the gate electrode 107 may be formed of an organic matter or an inorganic matter such as $SiN_x$ and $SiO_2$.

The gate electrode 107 may be formed of a metal or a metal alloy such as Au, Ag, Cu, Ni, Pt, Pd, Al, Mo, or an alloy thereof such as Al:Nd or Mo:W, but the present invention is not limited thereto. Thus, the gate electrode 107 may be formed of any of various materials in consideration of adhesion with an adjacent layer, flatness of the gate electrode 107, electrical resistance, and processability. The gate electrode 107 is connected to a gate line (not shown) that applies a TFT on/off signal.

An interlayer insulation layer 108 is formed of an insulating material and is formed on the gate electrode 107 to cover the gate electrode 107.

The source electrode 109 and the drain electrode 110 are formed on the interlayer insulation layer 108 to form the TFT. The source electrode 109 and the drain electrode 110 contact the source region and the drain region, respectively, of the active layer 105 through holes in the interlayer insulation layer 108.

The source electrode 109 and the drain electrode 110 may contain Ti, which has excellent electrical characteristic and durability and also has excellent contact characteristic with a layer below. Additionally, the source electrode 109 and the drain electrode 110 may each be formed as a stacked layer structure of Ti/Al/Ti.

In addition, a pad part 112 is formed on the interlayer insulation layer 108 at the non-display region A2. The pad part 112 may be formed of the same material as the source electrode 109 and the drain electrode 110. That is, the pad part 112 may contain Ti. Additionally, the pad part 112 may be formed as a stacked layer structure of Ti/Al/Ti. Since the pad part 112 has Ti, which has excellent electrical characteristic and durability, the pad part 112 is prevented from being damaged during a following process. Thus, an electrical circuit driving characteristic can be improved.

A planarization layer 113 is formed on the TFT. That is, the planarization layer 113 is formed on the source electrode 109 and the drain electrode 110. The planarization layer 113 may be formed of any of various insulating materials. For example, the planarization layer 113 may be formed of an inorganic matter, such as an oxide and a nitride, or an organic matter.

An inorganic insulation layer for forming the planarization layer 113 may include, for example, $SiO_2$, $SiN_x$, SiON, $Al_2O_3$, $TiO_2$, $Ta_2O_5$, $HfO_2$, $ZrO_2$, BST, or PZT. An organic insulation layer for forming the planarization layer 113 may include any of general purpose polymers (PMMA, PS), polymer derivatives having a phenol group, acrylic polymers, imide polymer, aryl ether polymers, amide polymers, fluoride polymers, p-xylene polymers, vinyl alcohol polymers and blends thereof. The planarization layer 113 may be formed of a complex stacked compound of an inorganic insulation layer and an organic insulation layer.

A passivation layer 114 is formed on the non-display region A2 to expose at least one side of the pad part 112. In more detail, the passivation layer 114 is formed to cover a top edge and side of the pad part 112. The pad part 112 may be formed of any of various insulating materials, and also may be formed of the same material as the planarization layer 113.

The pixel electrode 115 is formed on the planarization layer 113. The pixel electrode 115 is electrically connected to the drain electrode 110 and is formed having a predetermined pattern through a photolithography method.

The pixel electrode 115 may include indium tin oxide (ITO). Additionally, the pixel electrode 115 may be formed as a stacked layer structure of ITO/Ag/ITO. Due to the Ag layer contained in the pixel electrode 115, visible rays progressing into the pixel electrode 115 among visible rays generated by the organic light emitting layer 130 may be reflected toward the opposite electrode 140.

Then, a first transmissive conductive layer 121 and a second transmissive conductive layer 122 are sequentially formed on the pixel electrode 115 in the first sub pixel SP1. Additionally, the first transmissive conductive layer 121, and not the second transmissive conductive layer 122, is formed on the pixel electrode 115 in the second sub pixel SP2. The first transmissive conductive layer 121 and the second transmissive conductive layer 122 are not formed on the pixel electrode 115 in the third sub pixel SP3. The first transmissive conductive layer 121 and the second transmissive conductive layer 122 may be formed using ITO.

The first transmissive conductive layer 121 and the second transmissive conductive layer 122 may each have a predetermined pattern. For this, the first transmissive conductive layer 121 and the second transmissive conductive layer 122 are formed using a photolithography method, and a wet etching process is performed during the photolithography method. A wet etchant may contact the exposed side of the pad part 112 during the wet etching process.

The pad part 112 is electrically connected to the source electrode 109 and the drain electrode 110 (in each of the sub pixels), and thus is electrically connected to the pixel electrode 115 (in each of the sub pixels).

In addition, the ITO in the first transmissive conductive layer 121 and the second transmissive conductive layer 122 and the Ti in the pad part 112 have a large standard reduction potential difference. Therefore, since a galvanic corrosion phenomenon occurs between the first transmissive conductive layer 121, the second transmissive conductive layer 122, and the pad part 112 during the wet etching process, etching efficiency of the first transmissive conductive layer 121 and the second transmissive conductive layer 122 can be improved by having a larger standard reduction potential absolute value. The first transmissive conductive layer 121 and the second transmissive conductive layer 122 having a required pattern, which may be etched uniformly via the above method, can be formed easily.

According to processes performed on 121 and 122, thicknesses of 121 and 122 may vary.

A pixel define layer 125 is formed on the pixel electrode 115 (in the third sub pixel SP3), the first transmissive conductive layer 121 (in the second sub pixel SP2), and the second transmissive conductive layer 122 (in the first sub pixel SP1). The pixel define layer 125 is formed to expose predetermined portions of the second transmissive conductive layer 122 of the first sub pixel SP1, the first transmissive conductive layer 121 of the second sub pixel SP2, and the pixel electrode 115 of the third sub pixel SP3. The pixel define layer 125 may be formed of an organic matter or an inorganic mater.

Then, the organic light emitting layer 130 is formed. Specifically, the first sub pixel SP1 includes an organic light emitting layer 130a for emitting red visible rays, the second sub pixel SP2 includes an organic light emitting layer 130b for emitting green visible rays, and the third sub pixel SP3 includes an organic light emitting layer 130c for emitting blue visible rays.

The organic light emitting layer 130 is formed of any of various materials. In more detail, the organic light emitting layer 130a for emitting red visible rays may include a red lighting material such as tetraphenylnaphthacene, rubrene, Tris(1-phenylisoquinoline)Ir(III) (Ir(piq)3), Bis(2-benzo[b] thiophene-2-il-pyridine) (acetylacetonate)Ir(III) (Ir(btp)2 (acac)), Tris(di benzoyl methane)penanteurolrin Eu(III) (Eu (dbm)3(phen)), Tris[4,4'-di-tert-butyl-(2,2')-bipyridine]Ru (III)complex(Ru(dtb-bpy)3*2(PF6)), DCM1, DCM2, Eu(thenoyltrifluoroacetone)3(Eu(TTA)3, or bytyl-6-(1,1,7, 7-tetramethyl julroridil-9-enil)-4H-pyran) (butyl-6-(1,1,7,7-tetramethyljulolidyl-9-enyl)-4H-pyran: DCJTB). Alternatively, the organic light emitting layer 130a may include a polymer light emitting material such as a polyfluorene polymer or a polyvinyl polymer.

In addition, the organic light emitting layer 130b for emitting green visible rays may include a green light emitting material such as 3-(2-benzothiazole)-7-(dimethylamino) Coumarin 6, 2,3,6,7-tetrahydro-1,1,7,7,-tetramethyl-1H,5H, 11H-10-(2-benzothiazole)quinolizino-[9,9a,1gh]coumarin (C545T), N,N'-demethyl-DMQA, or Tris(2-phenyl pyridine) Ir(III) (Ir(ppy)3). Alternatively, the organic light emitting layer 130b may include a polymer light emitting material such as a polyfluorene polymer or a polyvinyl polymer.

In addition, the organic light emitting layer 130c for emitting blue visible rays may include a blue light emitting material such as oxadiazole dimer dyes (Bis-DAPDXP)), spiro compounds (Spiro-DPVBi, Spiro-6P), triarylamine compounds, bis(styryl)amine(DPVBi, DSA), 4,4'-bis(9-ethyl-3-carbazole vinylene)-1,1'-biphenyl (BCzVBi), perylene, 2,5, 8,11-tetra-tert-butylperylene (TPBe), 9H-carbazole-3,3'-(1, 4-phenylene-di-2,1-ethene-diyl)bis[9-ethel-(9C)](BCzVB), 4,4-bis[4-(di-p-tolylamino)styryl]biphenyl (DPAVBi), 4-(di-p-tolylamino)-4'-[(di-p-tolylamino)styryl]stilbene (DPAVB), 4,4'-bis[4-(diphenylamino)styryl]biphenyl (BDAVBi), or Bis(3,5-difluoro-2-(2-pyridyl)phenyl-(2-carboxypyridyl)Ir III (FIrPic). Alternatively, the organic light emitting layer 130c may include a polymer light emitting material such as a polyfluorene polymer or a polyvinyl polymer.

Although not illustrated in the drawings, it is apparent that an electron hole injection layer or an electron hole transfer layer may be formed before the organic light emitting layer 130 is formed over all the sub pixels.

The opposite electrode 140 is formed on the organic light emitting layer 130. The opposite electrode 140 may be formed to cover all the sub pixels.

The opposite electrode 140 is formed by depositing a transparent conductive material such as ITO, IZO, ZnO, or $In_2O_3$ after metal having a small work function such as Ag, Mg, Al, Pt, Pd, Au, Ni, Nd, Ir, Cr, Li, Ca or a compound thereof is deposited on the deposited on the above result.

In the present embodiment, the pixel electrode 115 is defined as an anode and the opposite electrode 140 is defined as a cathode, but the present invention is not limited thereto, and thus polarities thereof may be interchangeable.

Although not illustrated in the drawings, an electron transfer layer or an electron injection layer may be disposed over all the sub pixels between the organic light emitting layer 130 and the opposite electrode 140.

A sealing member (not shown) may be disposed to face one side of the substrate 101, for example, the sealing member may be disposed on the opposite electrode 140. The sealing member (not shown) is formed of a transparent material and protects the organic light emitting layer 130 from external moisture or oxygen. For this, the sealing member may have a structure in which glass, plastic, or an organic matter and an inorganic matter are stacked a plurality of times.

In the organic light emitting display apparatus 100 the first transmissive conductive layer 121 and the second transmissive conductive layer 122 are separately formed on the pixel electrode 115 for each sub pixel. That is, a stacked layer structure of one pixel electrode 115/the first transmissive conductive layer 121/the second transmissive conductive layer 122 is formed on the first sub pixel SP1 for emitting red visible rays. A stacked layer structure of one pixel electrode 115/the first transmissive conductive layer 121 is formed on the second sub pixel SP2 for emitting green visible rays. One pixel electrode 115 is formed on the third sub pixel SP3 for emitting blue visible rays.

Through this, optical path lengths of visible rays that progress toward the pixel electrodes 115 and then progress toward the opposite electrode 140 after being reflected by the pixel electrodes 115 among visible rays generated by the organic light emitting layer 130 may vary for each sub pixel, such that a microcavity effect can be realized.

At this point, by adjusting the thicknesses of the first transmissive conductive layer 121 and the second transmissive conductive layer 122, the optical path lengths may be adjusted for each sub pixel to emit different color visible rays. Through this, color purity and optical efficiency of visible rays realized by each sub pixel can be improved, and as a result, image quality of the organic light emitting display apparatus 100 is improved.

In addition, the organic light emitting display apparatus 100 is formed to expose one side of the pad part 112 at the non-display region A2. Through this, a uniform pattern of the first transmissive conductive layer 121 and the second transmissive conductive layer 122 can be formed easily using a galvanic erosion phenomenon.

FIGS. 3A through 3D are sequential sectional views illustrating a method of manufacturing the organic light emitting display apparatus 100 of FIGS. 1 and 2, according to an embodiment of the present invention.

Figure 3A:
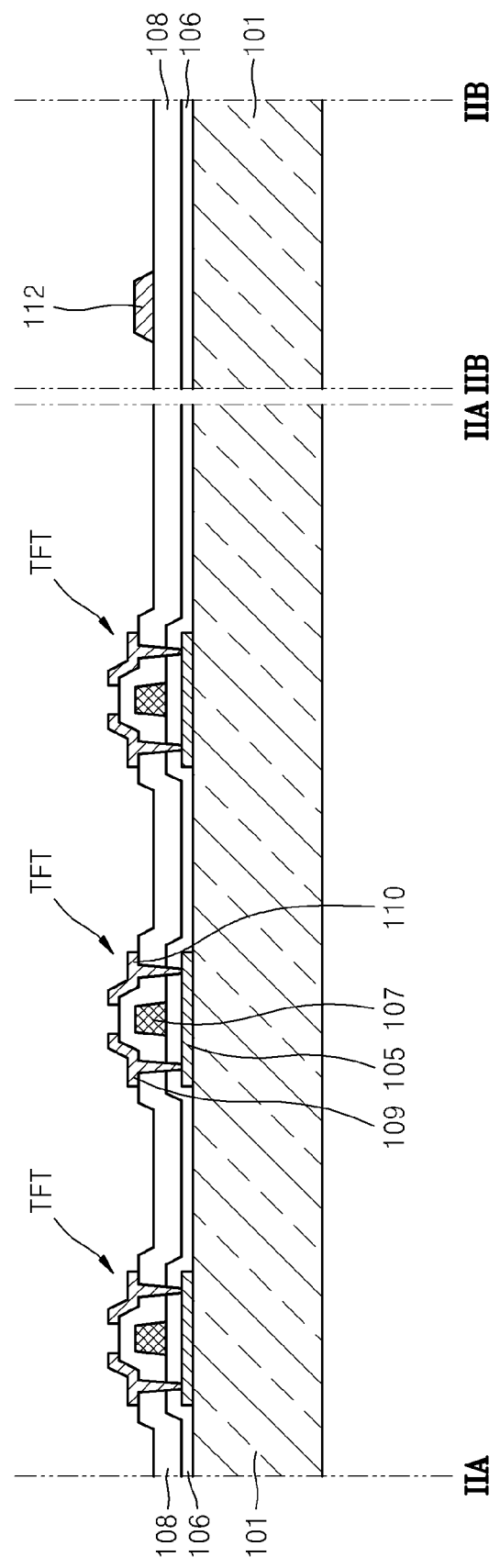
FIGS. 3A through 3E are sequential sectional views illustrating a method of manufacturing an organic light emitting display apparatus according to an embodiment of the present invention.

Referring to FIG. 3A, a TFT including an active layer 105, a gate electrode 107, a source electrode 109, and a drain electrode 110 is formed on a substrate 101. One TFT is included in one sub pixel. According to an aspect of the present invention, one sub pixel includes one TFT, but the present invention is not limited thereto. That is, a plurality of TFTs may be included in one sub pixel.

In more detail, (with respect to one sub pixel,) the active layer 105 is formed on the substrate 101. Although not illustrated in the drawings, a buffer layer (not shown) is formed before the forming of the active layer 105. A gate insulation layer 106 is formed to cover the active layer 105 and the gate electrode 107 is formed on the gate insulation layer 106. Then, an interlayer insulation layer 108 is formed, and the source electrode 109 and the drain electrode 110 are formed on the interlayer insulation layer 108 to be electrically connected to the active layer 105.

A pad part 112 may be formed on a non-display region during the forming of the source electrode 109 and the drain electrode 110. The source electrode 109 and the drain electrode 110 may be formed of Ti, for example, with a stacked layer structure of Ti/Al/Ti. The pad part 112 may be formed of Ti, and especially, may be formed as a stacked layer structure of Ti/Al/Ti. A conductive layer containing Ti is coated on a display region and a non-display region and then the source electrode 109, the drain electrode 110, and the pad part 112 are simultaneously formed using a patterning method such as a photolithography method. Although not illustrated in the drawings, the pad part 112 may be electrically connected to the source electrode 109 and the drain electrode 110.

Figure 3B:
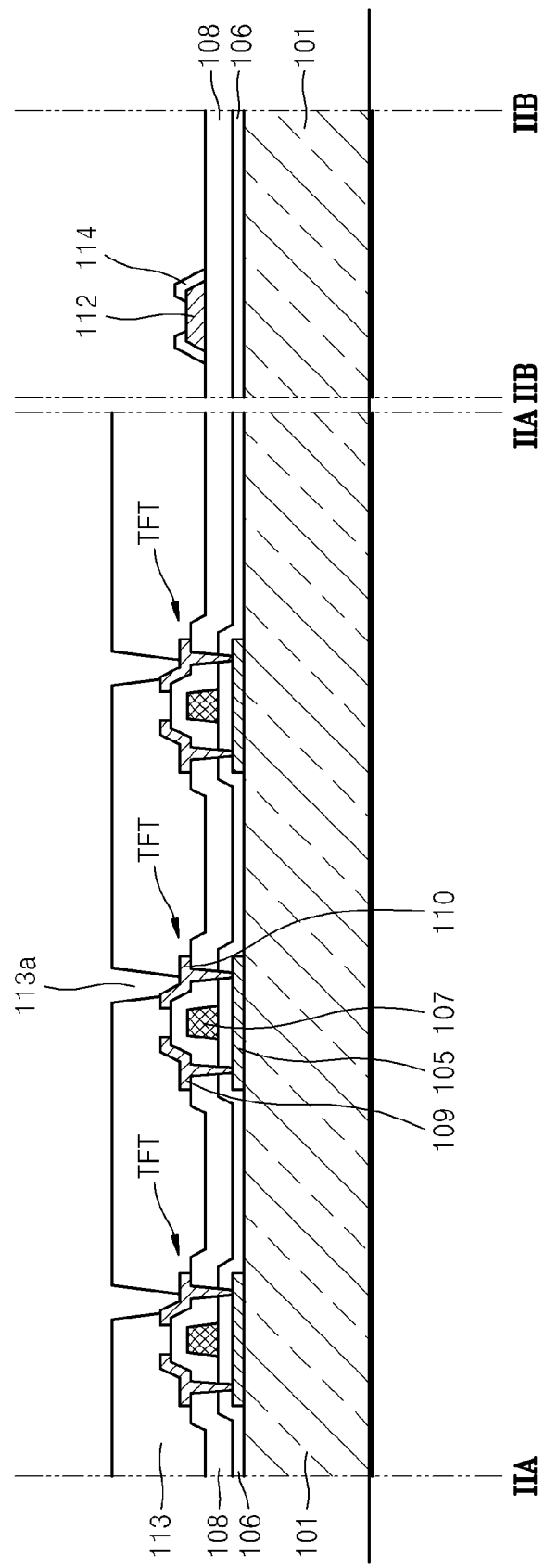

Then, referring to FIG. 3B, a planarization layer 113 formed of an insulating material is formed to cover the source electrode 109 and the drain electrode 110 and then a contact hole 113a is formed in the planarization layer 113. At this point, the drain electrode 110 is exposed through the contact hole 113a. A photolithography method is used in forming the contact hole 113a.

At this point, a passivation layer 114 is formed on the pad part 112. The passivation layer 114 is formed of the same material as the planarization layer 113, and may cover the side and top edge of the pad part 112 in such a way so as to expose one side of the pad part 112.

Figure 3C:
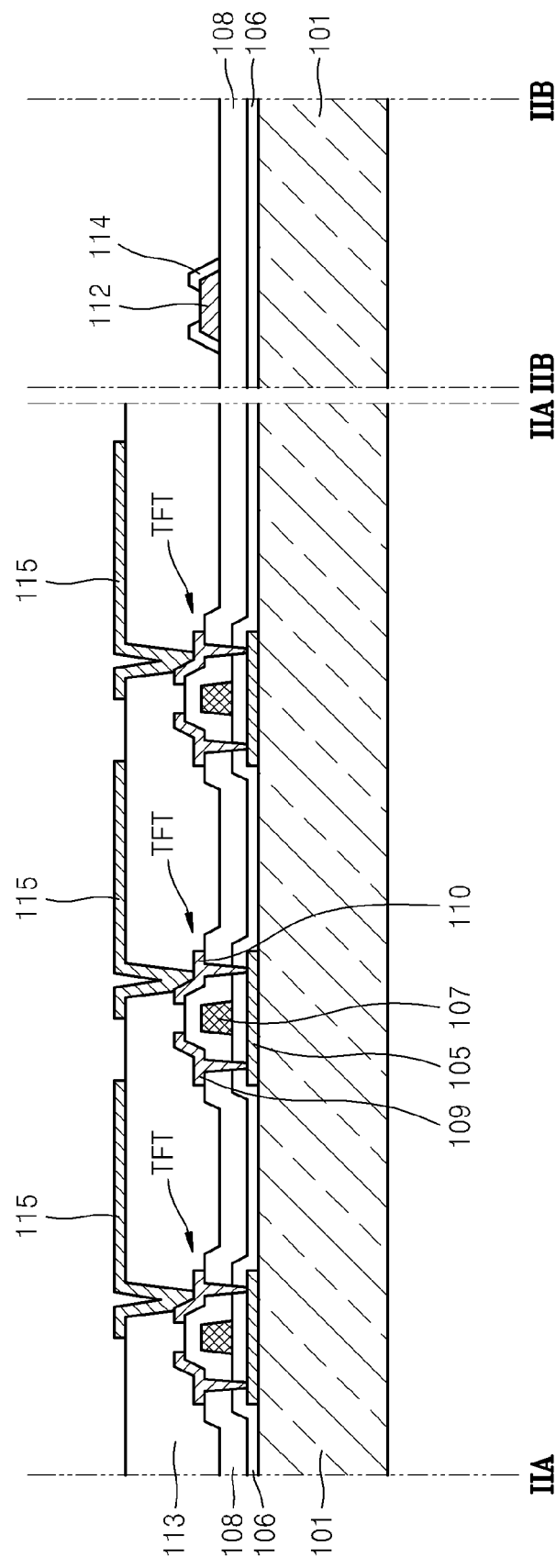

Then, a pixel electrode 115 is formed as shown in FIG. 3C. The pixel electrode 115 is connected to the drain electrode 110. The pixel electrode 115 includes ITO and may have a stacked layer structure of ITO/Ag/ITO. Here, an Ag reflection layer is formed to obtain a microcavity effect. The microcavity effect allows visible rays that progress toward a pixel electrode, among visible rays generated by an organic light emitting layer to be formed during a following process, to be reflected.

Additionally, when the pixel electrode 115 has a stacked layer structure of ITO/Ag/ITO, an ITO portion contacts the planarization layer 13 so that adhesiveness between the pixel electrode 115 and the planarization layer 113 can be improved.

Figure 3D:
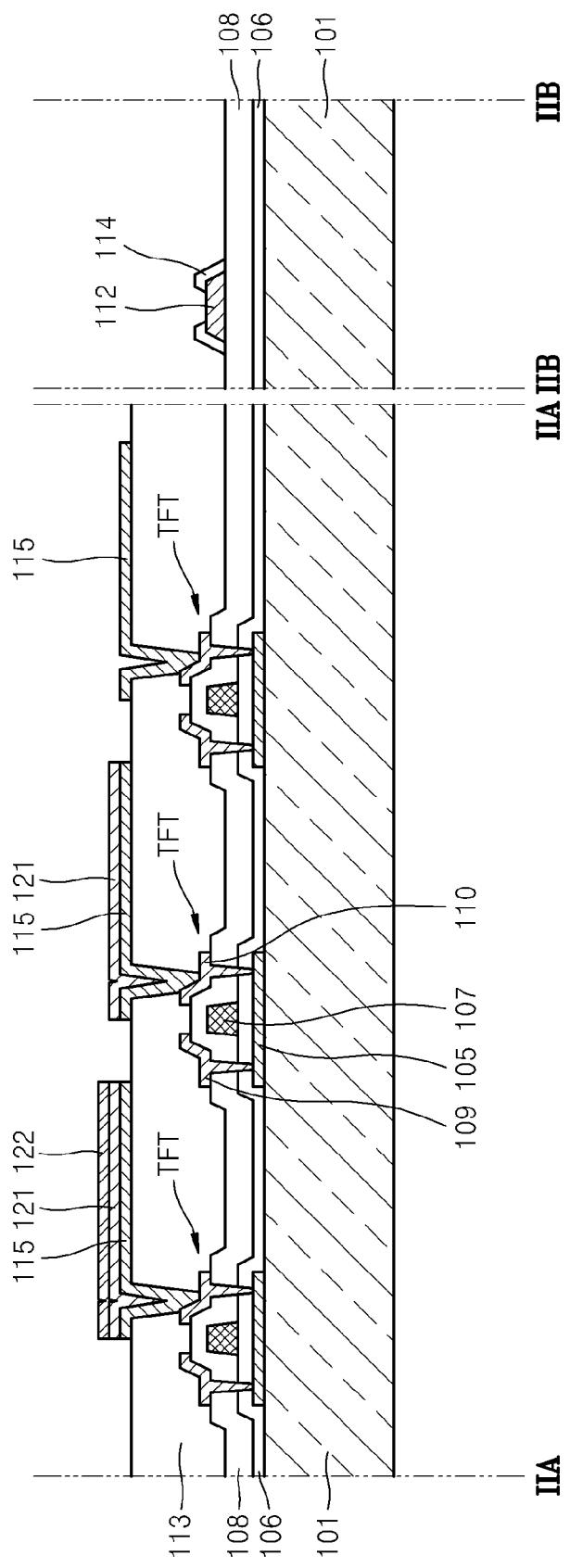

Then, referring to FIG. 3D, a first transmissive conductive layer 121 and a second transmissive conductive layer 122 are formed. As shown in FIG. 3D, there are three pixel electrodes 115 corresponding to three sub pixels.

As shown in FIG. 3D, the first transmissive conductive layer 121 and the second transmissive conductive layer 122 are formed on the pixel electrode 115 at the most left position of FIG. 3D. Also, only the first transmissive conductive layer 121, and not the second transmissive conductive layer 122, is formed on the pixel electrode 115 at the middle position of FIG. 3D and the first and second transmissive conductive layers 121 and 122 are not formed on the pixel electrode 115 at the most right position of FIG. 3D.

A patterning method such as a photolithography method is used to form the first transmissive conductive layer 121 and the second transmissive conductive layer 122, and then during such a process, a wet etching process is performed.

During the wet etching process, a wet etching solution is used and is applied to cover an entire surface of the substrate 101. Thus, the wet etching solution contacts the first transmissive conductive layer 121 and the second transmissive conductive layer 122 and also the exposed side of the pad part 112.

At this point, ITO in the first transmissive conductive layer 121 and second transmissive conductive layer 122 and Ti in the pad part 112 have a great standard reduction potential difference, and thereby a galvanic erosion phenomenon occurs. That is, compared to when the pad part 112 is not exposed and a wet etching solution does not contact the pad part 112, the first transmissive conductive layer 121 and the second transmissive conductive layer 122 containing ITO may be etched more easily.

The wet etching process is an important process that determines accuracy of patterning during a patterning process using a photolithography method. If etching efficiency is improved, a patterning time is reduced and accuracy of the patterned pattern and its sectional plane can be improved.

Especially, since the first transmissive conductive layer 121 and the second transmissive conductive layer 122 are separately formed at each sub pixel, it is important that first transmissive conductive layer 121 and the second transmissive conductive layer 122 are disposed at a required position and having a required pattern. This improves a wet etching process efficiency in regards to the first transmissive conductive layer 121 and the second transmissive conductive layer 122 containing ITO, such that the first transmissive conductive layer 121 and the second transmissive conductive layer 122 can be formed having a required uniform pattern easily.

Figure 3E:
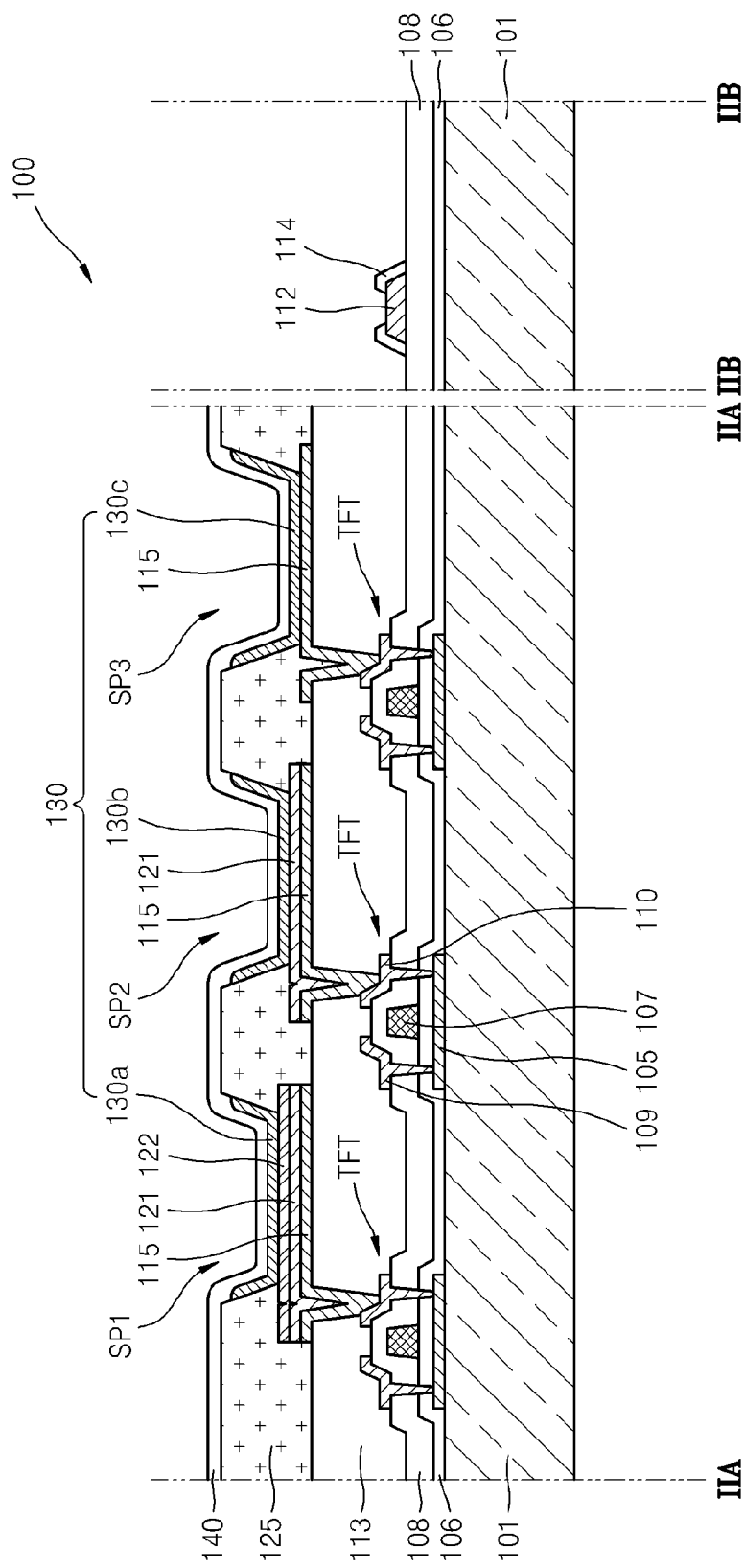

Then, referring to FIG. 3E, a pixel define layer 125 is formed on the first transmissive conductive layer 121 at the middle of FIG. 3E, the second transmissive conductive layer 122 on the most left position of FIG. 3E, and the pixel electrode 115 on the most right position of FIG. 3E. An opening is formed in the pixel define layer 125 to expose the second transmissive conductive layer 122 on the pixel electrode 115 at the most left position of FIG. 3E, the first transmissive conductive layer 121 on the pixel electrode 115 at the middle of FIG. 3E, and the pixel electrode 115 at the most right position of FIG. 3E, and then an organic light emitting layer 130 and an opposite electrode 140 are formed thereon.

In more detail, an organic light emitting layer 130a for emitting red visible rays is formed on the second transmissive conductive layer 122 on the pixel electrode 115 at the most left position of FIG. 3E. An organic light emitting layer 130b for emitting green visible rays is formed on the first transmissive conductive layer 121 on the pixel electrode 115 at the middle of FIG. 3E. An organic light emitting layer 130c for emitting blue visible rays is formed on the pixel electrode 115 at the most right position of FIG. 3E. The opposite electrode 140 is commonly formed over all the sub pixels. Thus, the organic light emitting display apparatus 100 including a first sub pixel SP1, a second sub pixel SP2, and a third sub pixel SP3 can be manufactured.

The organic light emitting layer 130 is formed of any of various materials. The various materials are the same as in the above embodiment.

Although not illustrated in the drawings, an electron hole injection layer or an electron hole transfer layer may be formed before the organic light emitting layer 130 is formed over all the sub pixels.

The opposite electrode 140 is formed after metal having a small work function such as Ag, Mg, Al, Pt, Pd, Au, Ni, Nd, Ir, Cr, Li, Ca or a compound thereof is deposited on the above result by depositing a transparent conductive material such as ITO, IZO, ZnO, or $In_2O_3$.

Although not illustrated in the drawings, an electron transfer layer or an electron injection layer may be formed over all the sub pixels between the organic light emitting layer 130 and the opposite electrode 140.

In addition, a sealing member (not shown) may be disposed to face one side of the substrate 101. The sealing member (not shown) is formed of a transparent material and protects the organic light emitting layer 112 from external moisture or oxygen. For this, the sealing member may have a structure in which glass, plastic, or an organic matter and an inorganic matter are stacked a plurality of times.

In the organic light emitting display apparatus 100, the first transmissive conductive layer 121 and the second transmissive conductive layer 122 are separately formed on the pixel electrode 115 for each sub pixel. Thus, a microcavity effect can be realized.

At this point, etching efficiency of the first transmissive conductive layer 121 and the second transmissive conductive layer 122 can be improved by exposing one side of the pad part 112 and using a galvanic erosion phenomenon. The first transmissive conductive layer 121 and the second transmissive conductive layer 122 may be easily formed to have a uniform pattern.

That is, the first transmissive conductive layer 121 and the second transmissive conductive layer 122 having a required thickness and pattern are formed in the first sub pixel SP1. Only the first transmissive conductive layer 121 having a required thickness and pattern (that is, without the second transmissive conductive layer 122) is formed in the second sub pixel SP2. The first and second transmissive conductive layers 121 and 122 are not formed in the third sub pixel SP3.

As a result, the first and second transmissive conductive layers 121 and 122 having a required thickness and pattern can be easily formed, such that image quality of the organic light emitting display apparatus 100 can be improved without reduction of a microcavity effect.

Figure 5:
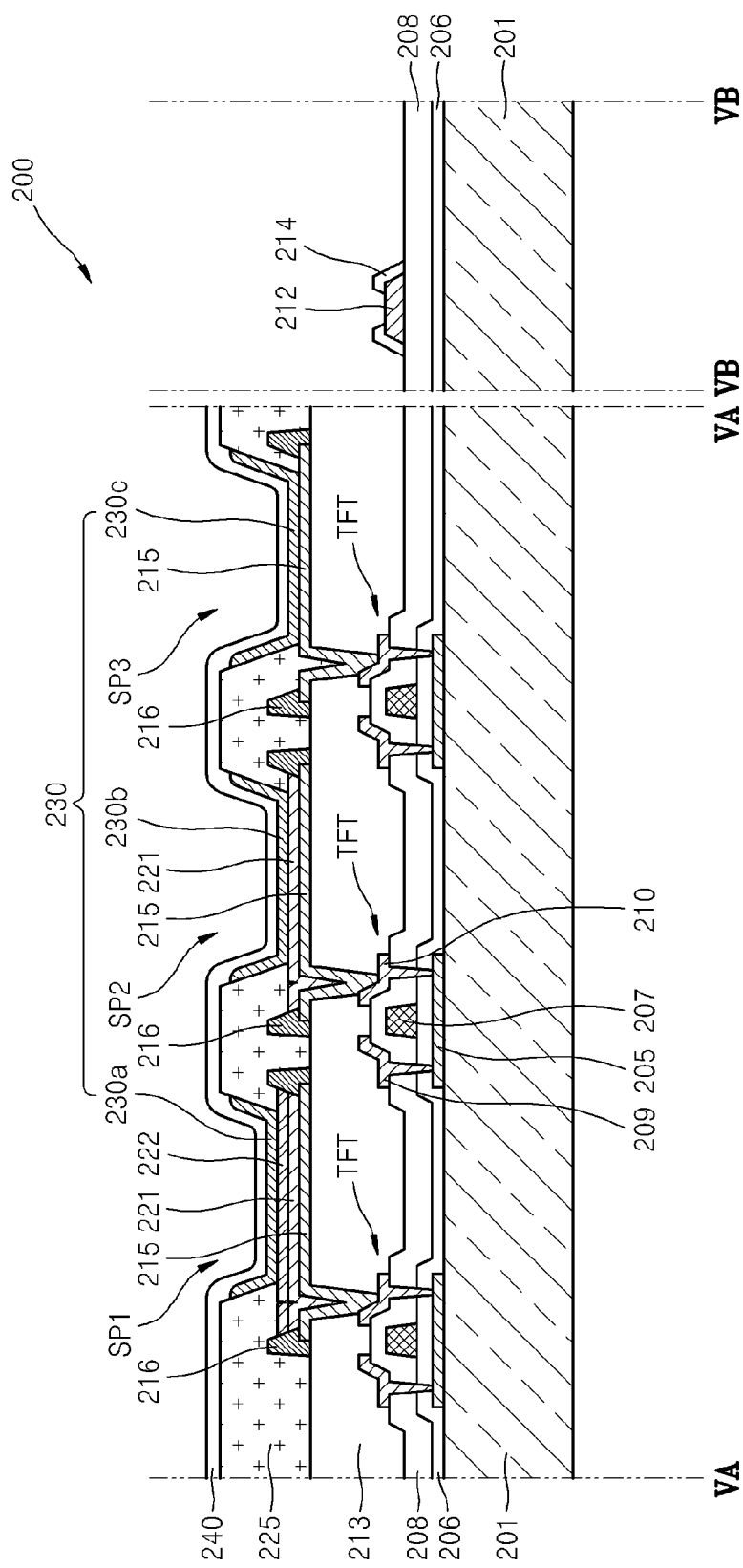
FIG. 5 is an enlarged sectional view taken at lines VA-VA and VB-VB of FIG. 4.

FIG. 4 is a plan view illustrating an organic light emitting display apparatus according to another embodiment of the present invention. FIG. 5 is an enlarged sectional view taken at lines VA-VA and VB-VB of FIG. 4.

An organic light emitting display apparatus 200 according to another aspect of the present invention includes a display region A1 and a non-display region A2 defined on a substrate 201. A first sub pixel SP1, a second sub pixel SP2, and a third sub pixel SP3 are disposed on the display region A1 in order to generate visible rays (of different colors). The sub pixels SP1, SP2, and SP3 may be sub pixels of different colors. According to an embodiment of the present invention, the first sub pixel SP1, the second sub pixel SP2, and the third sub pixel SP3 are defined as a red sub pixel, a green sub pixel, and a blue sub pixel, respectively. Although only one first sub pixel SP1, one second sub pixel SP2, and one third sub pixel SP3 are shown in FIGS. 4 and 5, this is just for convenience of description. Thus, the organic light emitting display apparatus 200 may include a plurality of the first sub pixels SP1, a plurality of the second sub pixels SP2, and a plurality of the third sub pixels SP3.

Each of the first sub pixel SP1, the second sub pixel SP2, and the third sub pixel SP3 includes a TFT, a pixel electrode 215, and an organic light emitting layer 230, and an opposite electrode 240.

A pad part 212 for applying an electrical signal or power to the display region A1 is disposed on the non-display region A2. The pad part 212 may be electrically connected to external circuits (not shown) during a following process.

Each of the TFTs included in the first sub pixel SP1, the second sub pixel SP2, and the third sub pixel SP3 includes an active layer 205, a gate electrode 207, a source electrode 209, and a drain electrode 210.

In more detail, configuration of each element will be described with reference to one TFT of FIG. 5.

First, the active layer 205 has a predetermined pattern and is formed on the substrate 201. Of course, a buffer layer (not shown) may be interposed between the substrate 201 and the active layer 205. A gate insulation layer 206 is formed on the active layer 205 and the gate electrode 207 is formed at a predetermined region on the gate insulation layer 206. An interlayer insulation layer 208 is formed of an insulating material on the gate electrode 207 to cover the gate electrode 207.

A detailed description about the substrate 201, the active layer 205, and the gate electrode 207 is the same as that with regard to like elements in the embodiment described above, and thus, descriptions thereof will be omitted.

The source electrode 209 and the drain electrode 210 are formed on the interlayer insulation layer 208 to form the TFT. The source electrode 209 and the drain electrode 210 contact a source region and a drain region of the active layer 205 through holes in the interlayer insulation layer 208.

The source electrode 209 and the drain electrode 210 may contain Ti. Additionally, the source electrode 209 and the drain electrode 210 may each be formed as a stacked layer structure of Ti/Al/Ti.

In addition, a pad part 212 is formed on the interlayer insulation layer 208 at the non-display region A2. The pad part 212 may be formed of the same material as the source electrode 209 and the drain electrode 210. That is, the pad part 212 may contain Ti. Additionally, the pad part 212 may be formed as a stacked layer structure of Ti/Al/Ti. Since the pad part 212 has Ti, which has excellent electrical characteristic and durability, the pad part 212 is prevented from being damaged during a following process and thus an electrical circuit driving characteristic can be improved.

A planarization layer 213 is formed on the TFT. That is, the planarization layer 213 is formed on the source electrode 209 and the drain electrode 210. A material for forming the planarization layer 213 is the same as mentioned in the embodiment described above, and thus, a description thereof will be omitted.

A passivation layer 214 is formed on the non-display region A2 to expose at least one side of the pad part 212. In more detail, the passivation layer 214 is formed to cover a top edge and side of the pad part 212. The pad part 212 may be formed of any of various insulating material, and also may be formed of the same material as the planarization layer 213.

The pixel electrode 215 is formed on the planarization layer 213. The pixel electrode 215 is electrically connected to the drain electrode 210 and is formed having a predetermined pattern through a photolithography method.

The pixel electrode 215 may include ITO. Additionally, the pixel electrode 215 may be formed as a stacked layer structure of ITO/Ag/ITO. Due to the Ag layer contained in the pixel electrode 215, visible rays progressing into the pixel electrode 215 among visible rays generated by the organic light emitting layer 230 may be reflected toward the opposite electrode 240.

An insulating member 216 is disposed on the pixel electrode 215 to cover an outer edge of the pixel electrode 215. That is, the insulating member 216 covers a top edge and side of the pixel electrode 215. The insulating member 216 may be formed of any of various insulating materials and specifically may include acryl.

The insulating member 216 protects the top edge and side of the pixel electrode 215. Through this, the top edge and side of the pixel electrode 215 may not be damaged during a wet etching process to form the first transmissive conductive layer 221 and the second transmissive conductive layer 222 on the pixel electrode 215. Especially, an etching solution is easily prevented from penetrating into the side of the pixel electrode 215 to damage the Ag layer of the pixel electrode 215, which serves as a reflection layer.

After forming the pixel electrodes 215, the first transmissive conductive layer 221 and the second transmissive conductive layer 222 are sequentially formed on the pixel electrode 215 in the first sub pixel SP1. Additionally, the first transmissive conductive layer 221, and not the second transmissive conductive layer 121, is formed on the pixel electrode 215 in the second sub pixel SP2. The first transmissive conductive layer 221 and second transmissive conductive layer 222 may be formed of ITO.

The first transmissive conductive layer 221 and second transmissive conductive layer 222 may each have a predetermined pattern. For this, the first transmissive conductive layer 221 and second transmissive conductive layer 222 are patterned using a photolithography method, and a wet etching process is performed during the pattern forming process.

A wet etching solution contacts the exposed side of the pad part 212 during the wet etching process. The pad part 212 is electrically connected to the source electrode 209 and the drain electrode 210 (in each of the sub pixels), and thus is electrically connected to the pixel electrode 215 (in each of the sub pixels).

In addition, ITO in the first transmissive conductive layer 221 and the second transmissive conductive layer 222 and Ti in the pad part 212 have a great standard reduction potential difference. Therefore, a galvanic corrosion phenomenon occurs between the first transmissive conductive layer 221, the second transmissive conductive layer 222, and the pad part 212, and during the wet etching process, etching efficiency of the first transmissive conductive layer 221 and the second transmissive conductive layer 222 can be improved by having a larger standard reduction potential absolute value. The first transmissive conductive layer 221 and the second transmissive conductive layer 222 having a required pattern, which may be etched uniformly via the above method, may be formed easily.

According to processes performed on 221 and 222, thicknesses of 221 and 222 may vary.

Additionally, the first transmissive conductive layer 221 and the second transmissive conductive layer 222 are formed to contact a side of the insulating member 216. The first transmissive conductive layer 221 and second transmissive conductive layer 222 are formed to contact the insulating member 216, in such a way that the top surface of the pixel electrode 215 is not exposed, thereby improving durability of the pixel electrode 215.

A pixel define layer 225 is formed on the pixel electrode 215 (in the third sub pixel SP3), the first transmissive conductive layer 221 (in the second sub pixel SP2), and second transmissive conductive layer 222 (in the first sub pixel SP1). The pixel define layer 225 is formed to expose predetermined portions of the second transmissive conductive layer 222 of the first sub pixel SP1, the first transmissive conductive layer 221 of the second sub pixel SP2, and the pixel electrode 215 of the third sub pixel SP3. The pixel define layer 225 may be formed of organic or inorganic matter.

Then, the organic light emitting layer 230 is formed. Specifically, the first sub pixel SP1 includes an organic light emitting layer 230a for emitting red visible rays. The second sub pixel SP2 includes an organic light emitting layer 230b for emitting green visible rays. The third sub pixel SP3 includes an organic light emitting layer 230c for emitting blue visible rays.

The organic light emitting layer 230 is formed of any of various materials. The various materials are the same as in the embodiment described above.

Although not illustrated in the drawings, it is apparent that an electron hole injection layer or an electron hole transfer layer may be formed before the organic light emitting layer 230 is formed over all the sub pixels.

The opposite electrode 240 is formed on the organic light emitting layer 230. The opposite electrode 240 may be formed to cover all the sub pixels.

According to an aspect of the present invention, the pixel electrode 215 is defined as an anode and the opposite electrode 240 is defined as a cathode, but the present invention is not limited thereto, and thus polarities thereof may be interchangeable.

Although not illustrated in the drawings, an electron transfer layer or an electron injection layer may be disposed over all the sub pixels between the organic light emitting layer 230 and the opposite electrode 240.

A sealing member (not shown) may be disposed to face one side of the substrate 201, for example, the sealing member may be disposed on the opposite electrode 240. The sealing member (not shown) is formed of a transparent material and protects the organic light emitting layer 230 from external moisture or oxygen. For this, the sealing member may have a structure in which glass, plastic, or an organic matter and an inorganic matter are stacked.

In the organic light emitting display apparatus 200, optical path lengths of visible rays that progress toward the pixel electrode 215 and then progress toward the opposite electrode 240 after being reflected by the pixel electrode 215 among visible rays generated by the organic light emitting layer 230 may vary for each sub pixel, such that a microcavity effect can be obtained.

Through this, color purity and optical efficiency of visible rays generated in each sub pixel are enhanced, such that image quality of the organic light emitting display apparatus 200 is improved.

In addition, the organic light emitting display apparatus 200 is formed to expose one side of the pad part 212 at the non-display region A2. Through this, a uniform pattern of the first transmissive conductive layer 221 and the second transmissive conductive layer 222 can be easily formed using a galvanic erosion phenomenon.

In addition, the organic light emitting display apparatus 200 includes the insulating member 216 on the pixel electrode 215 to cover the outer edge of the pixel electrode 215. Through this, when the first transmissive conductive layer 221 and the second transmissive conductive layer 222 are formed on the pixel electrode 215, the insulating member 216 prevents the side and the top edge of the pixel electrode 215 from being damaged, and especially, prevents the Ag layer of the pixel electrode 215 from being damaged.

FIGS. 6A through 6F are sequential sectional views illustrating a method of manufacturing the organic light emitting display apparatus 200 of FIGS. 4 and 5, according to an embodiment of the present invention.

Figure 6A:
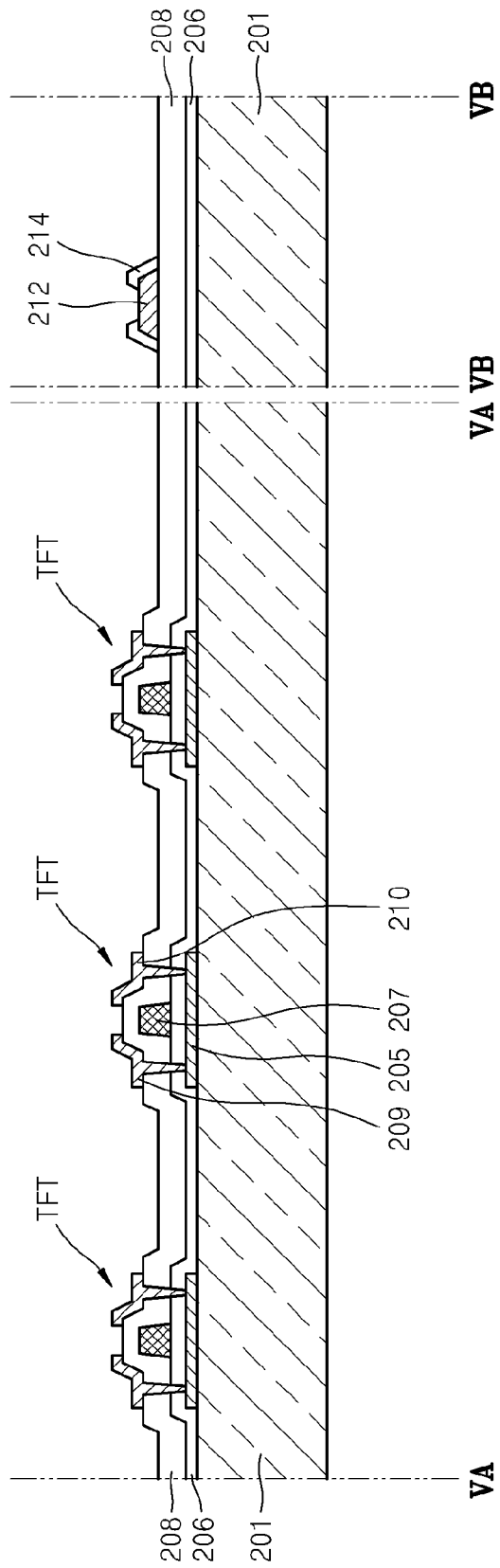

Referring to FIG. 6A, a TFT including an active layer 205, a gate electrode 207, a source electrode 209, and a drain electrode 210 is formed on a substrate 201. Although not illustrated in the drawings, a buffer layer (not shown) is formed before forming of the active layer 205.

In more detail, (with respect to one sub pixel,) a gate insulation layer 206 is formed to cover the active layer 205, and the gate electrode 207 is formed on the gate insulation layer 206. Then, an interlayer insulation layer 208 is formed, and the source electrode 209 and the drain electrode 210 are formed on the interlayer insulation layer 208 to be electrically connected to the active layer 205.

A pad part 212 may be formed on a non-display region during the forming of the source electrode 209 and the drain electrode 210. The source electrode 209 and the drain electrode 210 may be formed of Ti, for example, with a stacked layer structure of Ti/Al/Ti. The pad part 212 may be formed of Ti, and especially, with a stacked layer structure of Ti/Ai/Ti.

Although not illustrated in the drawings, the pad part 212 may be electrically connected to the source electrode 209 and the drain electrode 210.

Figure 6B:
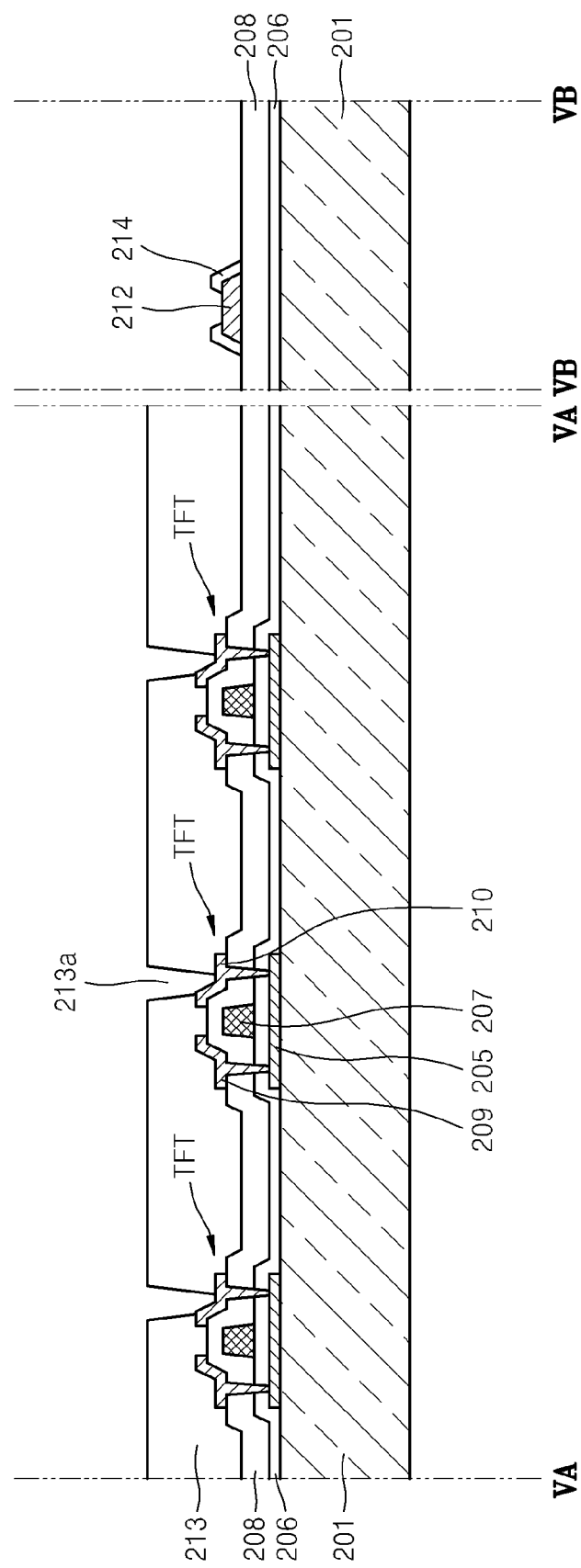

Then, referring to FIG. 6B, a planarization layer 213 formed with an insulating material is formed to cover the source electrode 209 and the drain electrode 210 and then a contact hole 213a is formed on the planarization layer 213. At this point, the drain electrode 210 is exposed through the contact hole 213a.

At this point, a passivation layer 214 is formed on the pad part 212. The passivation layer 214 is formed of the same material as the planarization layer 213, and may cover the side and top edge of the pad part 212 in such a way so as to expose one side of the pad part 212.

Figure 6C:
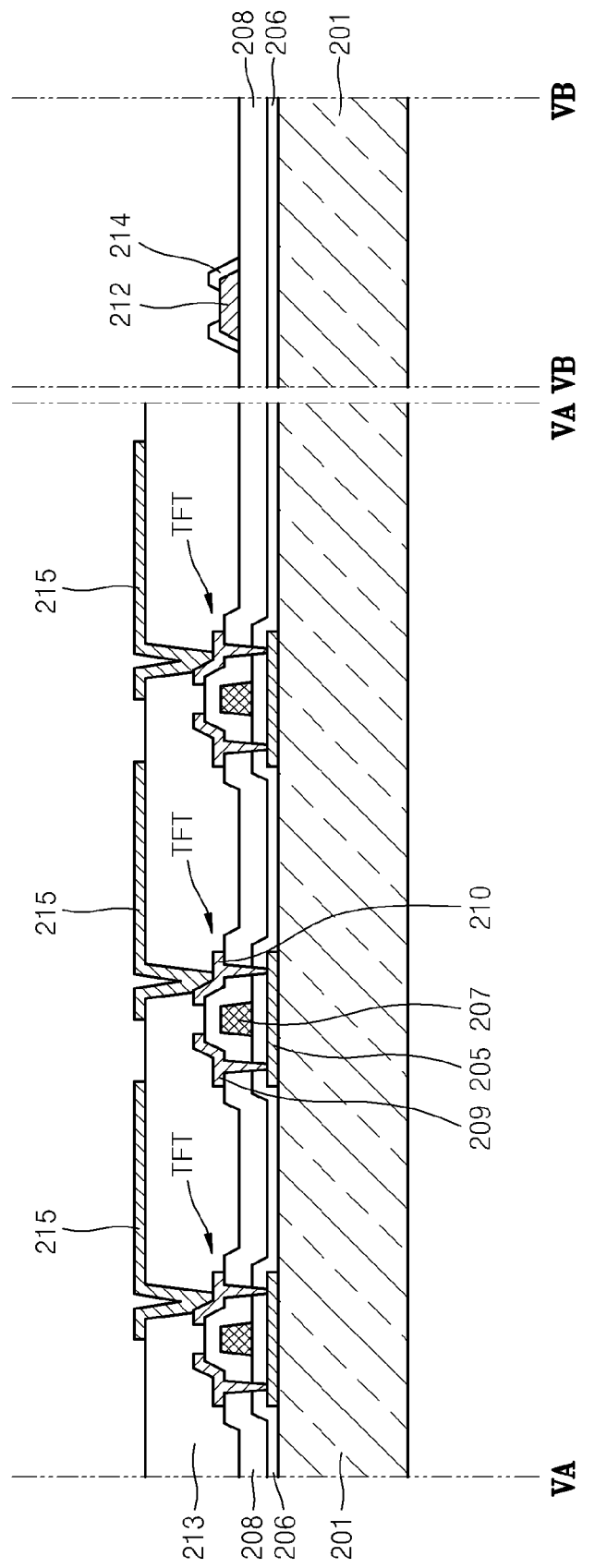

Then, a pixel electrode 215 is formed as shown in FIG. 6C. The pixel electrode 215 is connected to the drain electrode 210. The pixel electrode 215 includes ITO and may have a stacked layer structure of ITO/Ag/ITO.

Figure 6D:
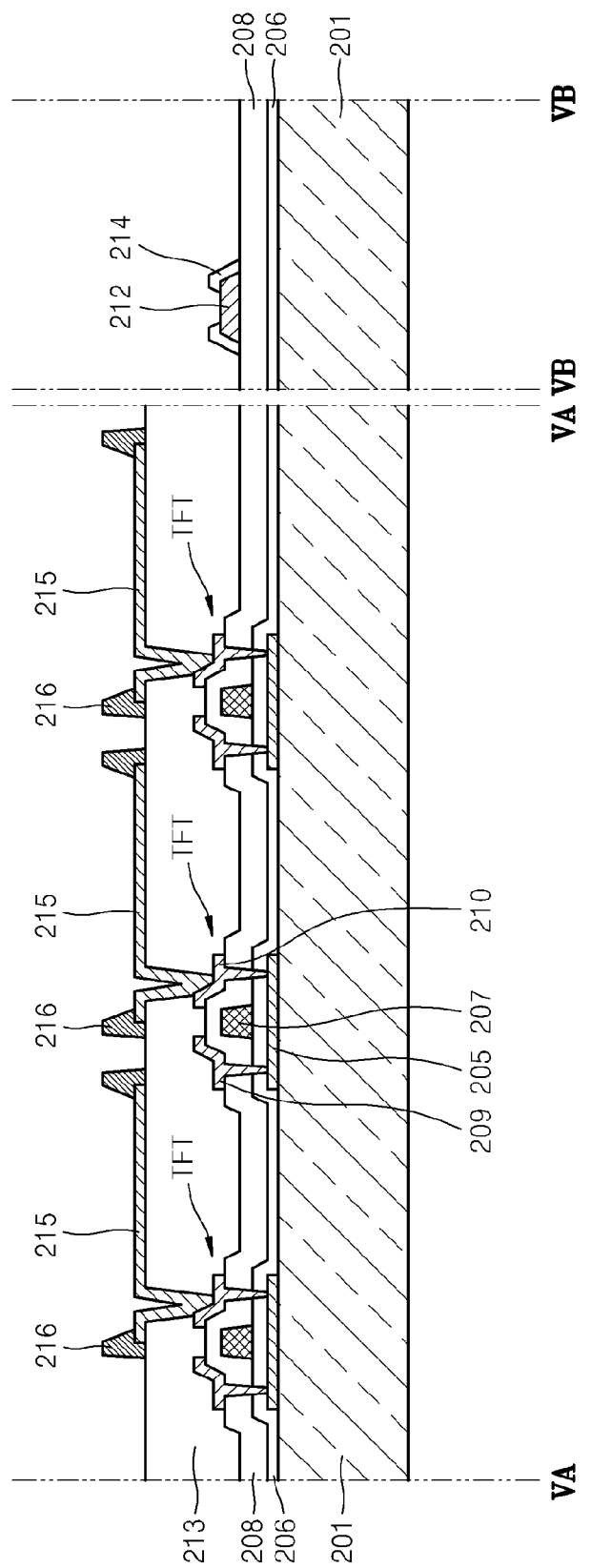

Then, referring to FIG. 6D, an insulating member 216 is formed on the pixel electrode 215. The insulating member 216 is formed to cover an outer edge of the pixel electrode 215. In more detail, the insulating member 216 is formed to cover a top edge and side of the pixel electrode 215. The insulating member 216 may be formed using an insulating material such as acryl.

The insulating member 216 protects the outer edge of the pixel electrode 215. That is, it prevents the etching solution from damaging the outer edge or a side of the pixel electrode 215 and from contacting the side of the pixel electrode 215, during a following process.

Figure 6E:
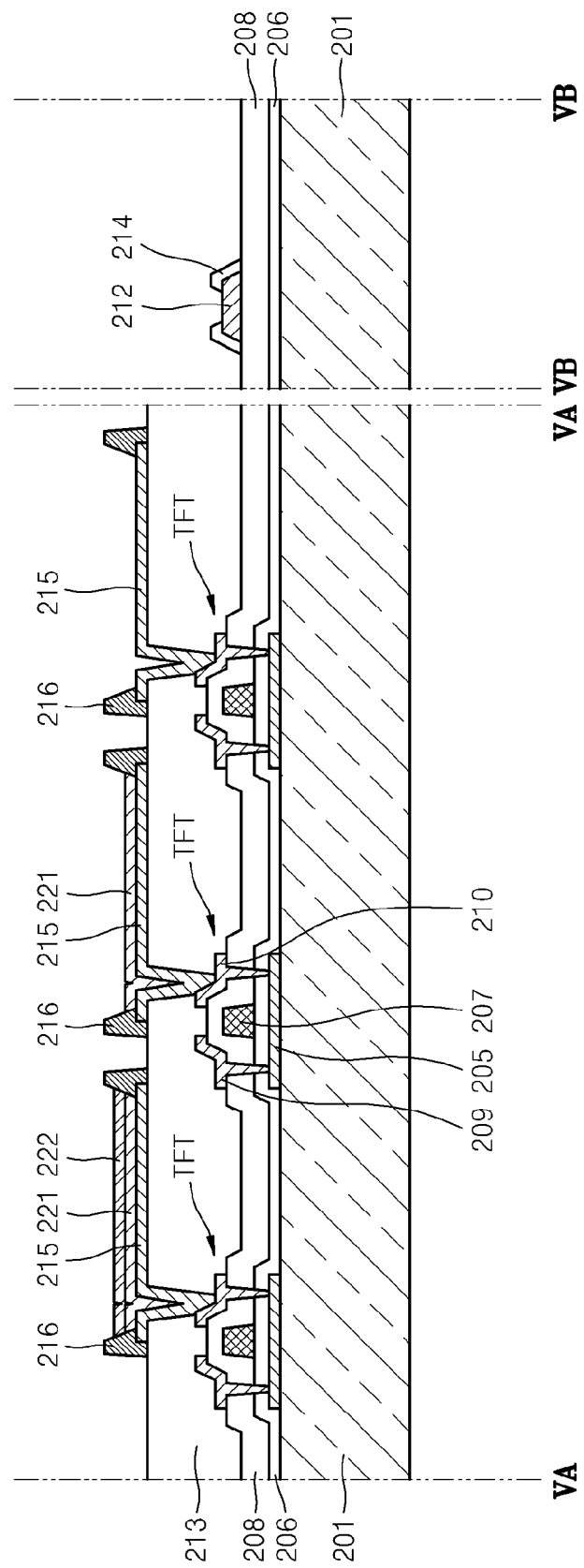

Then, referring to FIG. 6E, a first transmissive conductive layer 221 and a second transmissive conductive layer 222 are formed.

As shown in FIG. 6E, the first transmissive conductive layer 221 and the second transmissive conductive layer 222 are formed on the pixel electrode 215 at the most left position of FIG. 6E. Also, only the first transmissive conductive layer 222 (and not 221) is formed on the pixel electrode 215 at the middle position of FIG. 6E. The first and second transmissive conductive layers 221 and 222 are not formed on the pixel electrode 215 at the most right position of FIG. 6E.

A patterning method such as a photolithography method is used to form the first transmissive conductive layer 221 and the second transmissive conductive layer 222, and then during such a process, a wet etching process is performed.

During the wet etching process, a wet etching solution is used and is applied to cover an entire surface of the substrate 201. Thus, the wet etching solution contacts the first transmissive conductive layer 221 and the second transmissive conductive layer 222 and also the exposed side of the pad part 212.

At this point, ITO in the first transmissive conductive layer 221 and second transmissive conductive layer 222 and Ti in the pad part 212 have a great standard reduction potential difference, and thereby a galvanic erosion phenomenon occurs. That is, compared to when the pad part 212 is not exposed and a wet etching solution does not contact the pad part 212, the first transmissive conductive layer 221 and the second transmissive conductive layer 222 containing ITO may be etched more easily.

Through this, after a wet etching process is performed, the first transmissive conductive layer 221 and second transmissive conductive layer 222 may be easily formed having a required pattern.

In addition, the pixel electrode 215 may be damaged by an etching solution during a wet etching process, but according to an aspect of the present invention, the insulating member 216 can prevent the pixel electrode 215 from being damaged. That is, the insulating member 216 covers the top edge and side of the pixel electrode 215, in such a way that it prevents the outer edge of the pixel electrode 215 from being damaged by an etching solution. In more detail, an etching solution is prevented from penetrating into the top edge and side of the pixel electrode 215 to damage the Ag layer of the pixel electrode 215.

The Ag layer of the pixel electrode 215 serves as a reflection layer and through this a microcavity effect in the organic light emitting display apparatus can be achieved. Thus, if the Ag layer is damaged, the microcavity effect may not occur. Accordingly, the insulating member 216 prevents an etching solution from damaging the pixel electrode 215.

In addition, because of the insulating member 216, the first transmissive conductive layer 221 and second transmissive conductive layer 222 are easily disposed on the pixel electrode 215. At this point, the first transmissive conductive layer 221 and second transmissive conductive layer 222 are formed to contact a side of the insulating member 216. That is, the first transmissive conductive layer 221 and second transmissive conductive layer 222 are formed to contact the insulating member 216, in such a way that the top surface of the pixel electrode 215 is not exposed, thereby improving durability of the pixel electrode 215.

Referring to FIG. 6F, a pixel define layer 225 is formed on the first transmissive conductive layer 221 (at center), the second transmissive conductive layer 222 (in left), and the pixel electrode 215 (in right). Openings are formed in the pixel define layer 225 to expose the second transmissive conductive layer 221 on the pixel electrode 215 at the most left position of FIG. 6F, the first transmissive conductive layer 121 on the pixel electrode 215 at the middle of FIG. 6F, and the pixel electrode 215 at the most right of FIG. 6F, and then an organic light emitting layer 230 and an opposite electrode 240 are formed thereon.

In more detail, an organic light emitting layer 230a for emitting red visible rays is formed on the second transmissive conductive layer 222 on the pixel electrode 215 at the most left of FIG. 6F. An organic light emitting layer 230b for emitting green visible rays is formed on the first transmissive conductive layer 221 on the pixel electrode 215 at the middle of FIG. 6E. An organic light emitting layer 230c for emitting blue visible rays is formed on the pixel electrode 215 at the most right of FIG. 6F. The opposite electrode 240 is commonly formed such that the organic light emitting display apparatus 200 including a first sub pixel SP1, a second sub pixel SP2, and a third sub pixel SP3 can be manufactured.

Materials for forming the organic light emitting layer 230 and the opposite electrode 240 are the same as in the embodiment described above, and thus description thereof will be omitted.

Although not illustrated in the drawings, it is apparent that an electron hole injection layer or an electron hole transfer layer may be formed before the organic light emitting layer 230 is formed over all the sub pixels. Furthermore, it is apparent that an electron transfer layer or an electron injection layer may be disposed over all the sub pixels between the organic light emitting layer 230 and the opposite electrode 240.

Although not illustrated in the drawings, a sealing member (not shown) may be disposed to face one side of the substrate 201. The sealing member (not shown) is formed of a transparent material and protects the organic light emitting layer 212 from external moisture or oxygen. For this, the sealing member may have a structure in which glass, plastic, or an organic matter and an inorganic matter are stacked.

In the organic light emitting display apparatus 200, the first transmissive conductive layer 221 and the second transmissive conductive layer 222 are separately formed on the pixel electrode 215 for each sub pixel, such that a microcavity effect can be realized.

Furthermore, a galvanic erosion phenomenon caused by exposing one side of the pad part 212 is used, so that etching efficiency of the first transmissive conductive layer 221 and second transmissive conductive layer 222 can be improved. Through this, the first transmissive conductive layer 221 and second transmissive conductive layer 222 having a uniform pattern can easily be formed.

In addition, before forming the first transmissive conductive layer 221 and the second transmissive conductive layer 222, the insulating member 216 is formed to cover the side and the top edge of the pixel electrode 215. Therefore, during the forming of the first transmissive conductive layer 221 and the second transmissive conductive layer 222, an etching solution is prevented from damaging the side and top edge of the pixel electrode 215. Especially, an etching solution is prevented from penetrating into the side of the pixel electrode 215 to damage the Ag layer of the pixel electrode 215.

As a result, the pixel electrode 215 and the first and second transmissive conductive layers 221 and 222 are easily formed according to a designed configuration, such that image quality of the organic light emitting display apparatus 200 can be improved without reduction of a microcavity effect.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display apparatus, comprised of:
 a display region and a non-display region disposed on a substrate, the display region including a first sub pixel, a second sub pixel, and a third sub pixel, each of the first to third sub pixels comprising:
 a thin film transistor;
 a pixel electrode electrically connected to the thin film transistor;
 an organic light emitting layer electrically connected to the pixel electrode;
 an opposite electrode formed on the organic light emitting layer;
 an insulating member disposed to cover an outer edge of the pixel electrode; and
 a pad part disposed on the non-display region, the pad part including at least one side exposed,
 the first sub pixel including a first transmissive conductive layer and a second transmissive conductive layer sequentially stacked between the pixel electrode and the organic light emitting layer, and
 the second sub pixel including the first transmissive conductive layer formed between the pixel electrode and the organic light emitting layer,
 the first transmissive conductive layer and the second transmissive conductive layer contacting a side of the insulating member.

2. The organic light emitting display apparatus of claim 1, the pixel electrode comprising indium tin oxide (ITO).

3. The organic light emitting display apparatus of claim 1, the pixel electrode being formed as a stacked layer structure of ITO/Ag/ITO.

4. The organic light emitting display apparatus of claim 1, the organic light emitting layer comprising:
 an organic light emitting layer to emit red visible rays corresponding to the first sub pixel;
 an organic light emitting layer to emit green visible rays corresponding to the second sub pixel; and
 an organic light emitting layer to emit blue visible rays corresponding to the third sub pixel.

5. The organic light emitting display apparatus of claim 1, the pad part being formed of a same material as forms source and drain electrodes of each of the thin film transistors.

6. The organic light emitting display apparatus of claim 1, the pad part comprising Ti.

7. The organic light emitting display apparatus of claim 1, the pad part being formed as a stacked layer structure of Ti/Al/Ti.

8. The organic light emitting display apparatus of claim 1, the first transmissive conductive layer and the second transmissive conductive layer comprising ITO.

9. The organic light emitting display apparatus of claim 1, the insulating member being disposed to cover a top edge and side of the pixel 3 electrode.

10. The organic light emitting display apparatus of claim 1, the insulating member comprising acryl.

11. The organic light emitting display apparatus of claim 1, the first transmissive conductive layer and the second transmissive conductive layer having a same thickness.

12. The organic light emitting display apparatus of claim 1, the first transmissive conductive layer and the second transmissive conductive layer having different thicknesses.

13. A method of manufacturing an organic light emitting display apparatus including a display region and a non-display region disposed on a substrate, the display region including a first sub pixel, a second sub pixel, and a third sub pixel, the formation of each of the first to third sub pixels comprising:
 forming a thin film transistor on the substrate;
 forming a pixel electrode that is electrically connected to the thin film transistor;
 forming an insulating member disposed to cover an outer edge of the pixel electrode;
 forming an organic light emitting layer that is electrically connected to the pixel electrode; and
 forming an opposite electrode on the organic light emitting layer,
 a pad part being disposed on the non-display region, the pad part including at least one side exposed,
 the first sub pixel including a first transmissive conductive layer and a second transmissive conductive layer sequentially stacked between the pixel electrode of the first sub pixel and the organic light emitting layer,
 the second sub pixel including the first transmissive conductive layer between the pixel electrode of the second sub pixel and the organic light emitting layer, and
 the first transmissive conductive layer and the second transmissive conductive layer contacting a side of the insulating member.

14. The method of claim 13, the pixel electrode comprising ITO.

15. The method of claim 13, the pixel electrode being formed as a stacked layer structure of ITO/Ag/ITO.

16. The method of claim 13, the organic light emitting layer comprising:
 a first organic light emitting layer to emit red visible rays corresponding to the first sub pixel;
 a second organic light emitting layer to emit green visible rays corresponding to the second sub pixel; and a third organic light emitting layer to emit blue visible rays corresponding to the third sub pixel.

17. The method of claim 13, the pad part being formed of a same material as forms source and drain electrodes of each thin film transistor.

18. The method of claim 13, the pad part comprising Ti.

19. The method of claim 13, the pad part being formed as a stacked layer structure of Ti/Al/Ti.

20. The method of claim 13, the first transmissive conductive layer and the second transmissive conductive layer comprising ITO.

21. The method of claim 20, the first transmissive conductive layer and the second transmissive conductive layer being patterned using a wet etching method.

22. The method of claim 21, the exposed side of the pad part contacting a wet etching solution while the first transmissive conductive layer and the second transmissive conductive layer are patterned using the wet etching method.

23. The method of claim 13, the insulating member being formed to cover a top edge and side of the pixel electrode.

24. The method of claim 13, the insulating member including acryl.

25. The method of claim 13, the first transmissive conductive layer and the second transmissive conductive layer being formed after the insulating member is formed.

26. An organic light emitting display apparatus having a substrate having a display region including a first sub pixel, a second sub pixel, a third sub pixel, and a non-display region, the apparatus comprising:

a thin film transistor formed on the display region;

a pixel electrode formed on the thin film transistor and electrically connected to the thin film transistor;

an insulating member formed on the pixel electrode and disposed to cover an outer edge of the pixel electrode;

an organic light emitting layer formed on the pixel electrode and electrically connected to the pixel electrode;

an opposite electrode formed on the organic light emitting layer; and a pad part formed on the non-display region, the first sub pixel including a first transmissive conductive layer and a second transmissive conductive layer sequentially stacked between the pixel electrode and the organic light emitting layer, and the second sub pixel including the first transmissive conductive layer formed between the pixel electrode and the organic light emitting layer, and the first transmissive conductive layer and the second transmissive conductive layer contacting a side of the insulating member.

27. The organic light emitting display apparatus of claim 26, the insulating member being disposed to cover a top edge and side of the pixel electrode.

28. The organic light emitting display apparatus of claim 26, the insulating member comprising acryl.

* * * * *